United States Patent
Ueno et al.

(10) Patent No.: US 6,436,559 B1
(45) Date of Patent: Aug. 20, 2002

(54) ORGANIC LUMINESCENCE DEVICE

(75) Inventors: Kazunori Ueno, Ebina; Akihiro Senoo, Kawasaki; Seiji Mashimo, Yokahama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 56 days.

(21) Appl. No.: 09/708,479

(22) Filed: Nov. 9, 2000

(30) Foreign Application Priority Data

Nov. 12, 1999 (JP) .......................... 11-322820

(51) Int. Cl.$^7$ .............................. H05B 33/14
(52) U.S. Cl. ................... 428/690; 428/704; 428/917; 428/212; 428/216; 313/504; 313/506; 257/40; 257/103
(58) Field of Search .............. 428/690, 917, 428/216, 704, 212; 313/504, 506; 257/40, 103

(56) References Cited

U.S. PATENT DOCUMENTS

| | | | |
|---|---|---|---|
| 4,539,507 A | 9/1985 | VanSlyke et al. | 313/504 |
| 4,720,432 A | 1/1988 | VanSlyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,672,678 A | 9/1997 | Holmes et al. | 528/373 |
| 5,726,457 A | 3/1998 | Nakano et al. | 257/40 |
| 5,869,199 A | 2/1999 | Kido | 428/690 |

FOREIGN PATENT DOCUMENTS

| | | | | |
|---|---|---|---|---|
| EP | WO-98/49163 | * 11/1998 | ......... | C07D/471/04 |
| JP | 2-216791 | 8/1990 | | |
| JP | 2-247278 | 10/1990 | | |
| JP | 3-255190 | 11/1991 | | |
| JP | 4-145192 | 5/1992 | | |
| JP | 4-363891 | 12/1992 | | |
| JP | 5-202356 | 8/1993 | | |
| JP | 5-247460 | 9/1993 | | |
| JP | 7-41759 | 2/1995 | | |
| JP | 7-90260 | 4/1995 | | |
| JP | 9-202878 | 8/1997 | | |
| JP | 9-227576 | 9/1997 | | |

OTHER PUBLICATIONS

Tang, et al., "Organic Electroluminescent Diodes", *Appl. Phys. Lett.*, vol. 51, No. 12, pp. 913–915 (1987).
Burroughes, et al., "Light–emitting Diodes Based on Conjugated Polymers", *Nature*, vol. 347, pp. 539–541 (1990).
M. Onoda; Light–Emitting Diodes using n–type conducting polymer: Poly(p–pyridyl vinylene); J. Appl. Phys. vol. 78, No. 2, (1995) 1327–1333.
Patent Abst. of Japan, vol. 1999, No. 2 (1999) for JP 10-302960.

* cited by examiner

*Primary Examiner*—Cynthia H. Kelly
*Assistant Examiner*—Ling Xu
(74) *Attorney, Agent, or Firm*—Fitzpatrick, Cella, Harper & Scinto

(57) ABSTRACT

An organic luminescence is constituted by a pair of electrodes including an anode and a cathode, and an organic compound layer disposed between the pair of electrodes. The organic compound layer comprises a compound represented by the following formula (I):

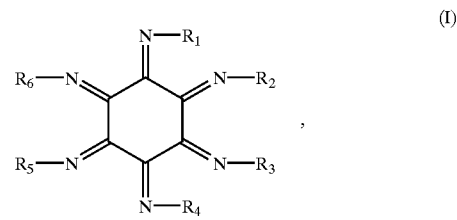

wherein $R_1$ to $R_6$ independently denote a substituted or unsubstituted alkyl group, a substituted or unsubstituted aryl group, a substituted or unsubstituted aralkyl group, or a substituted or unsubstituted heterocyclic group, with the proviso that each pair of $R_1$ and $R_2$, $R_3$ and $R_4$, an $R_5$ and $R_6$ or of $R_1$ and $R_6$, $R_2$ and $R_3$, and $R_4$ and $R_5$ may be connected to each other to form a fused ring structure.

19 Claims, 3 Drawing Sheets

ORGANIC LUMINESCENCE DEVICE

FIELD OF THE INVENTION AND RELATED ART

The present invention relates to an organic (electro-) luminescence device and particularly to an organic luminescence device for emitting light by applying an electric field to a film of an organic compound (organic compound layer).

An organic luminescence device generally comprises a pair of electrodes (comprising an anode and cathode) and a film comprising a fluorescent organic compound. Into the organic compound layer (film), holes and electrons are injected from the anode and the cathode, respectively, thus forming excitons of the fluorescent organic compound. When the excitons are returned to ground state, the organic luminescence device emits light or causes luminescence.

According to study by Eastman Kodak Co. ("Appl. Phys. Lett.", vol. 51, pp. 913- (1987)), it has been reported that a function-separation type organic luminescence layer comprising a layer of an aluminum quinolinol complex (as electron transporting and luminescent material) and a layer of a triphenylamine derivative (as hole transporting material) causes luminescence at a luminance (brightness) of ca. 1,000 cd/m$^2$ under application of a voltage of 10 volts. Examples of related U.S. Patents may include U.S. Pat. Nos. 4,539,507; 4,720,432 and 4,885,211.

Further, by changing species of the fluorescent organic compound, it is possible to effect luminescence in a broad wavelength region ranging from ultraviolet region to infrared region. In this regard, various compounds have been extensively studied in recent years. Such compounds has been proposed in, e.g., U.S. Pat. Nos. 5,151,629: 5,409,783 and 5,382,477, and Japanese Laid-Open Patent Applications (JP-A) Nos. 2-247278, 3-255190, 5-202356, 9-202878 and 9-227576.

In addition to the above-mentioned organic luminescence device using a conjugated polymer has been reported by a research group of Cambridge University ("Nature", vol. 347, pp. 539- (1990)). According to this report, a layer of polyphenylenevinylene (PPV) is formed through wet-coating process and luminescence by the use of single layer is confirmed. Such an organic luminescence device using a conjugated polymer has also been proposed by, e.g., U.S. Pat. Nos. 5,247,190; 5,514,878 and 5,672,678, and JP-A Nos. 4-145192 and 5-247460.

As described above, recent progress in organic luminescence device is noticeable and allows luminescent devices with high luminescence (brightness), various (light-) emission wavelengths, high-speed responsiveness, small thickness and light weight under application of lower voltage, thus suggesting possibility of wide applications.

However, the above-described organic luminescence devices are still required to effect light output (emission) at a higher luminance and/or a higher conversion efficiency in the present state. These organic luminescence devices are also still insufficient in terms of durability such that the devices are liable to be changed in their properties with time when used for a long period or liable to be deteriorated by the influence of ambient air containing oxygen or of humidity. Further, in the case of using the organic luminescence devices for full-color display, it is necessary to effect light emission of blue, green and red with good color purity. However, such light emission has not been realized satisfactorily.

As an electron injecting material, oxadiazole derivatives (e.g., JP-A 2-216791 and JP-A 4-363891) or triazine derivatives (e.g., JP-A 7-41759 and JP-A 7-90260) have been proposed. However, organic luminescence devices using such compounds are not sufficient in stability of film and electron injection efficiency, thus resulting in lower luminance (of emitted light) and the shorter life of the device.

SUMMARY OF THE INVENTION

A generic object of the present invention is to provide improvements to problems are mentioned above encountered in organic luminescence devices proposed heretofore.

A more specific object of the present invention is to provide an organic (electro-) luminescence device capable of effecting light output (emission) at high efficiency and luminance while realizing the prolonged life.

Another object of the present invention is to provide an organic luminescence device capable of providing a wide variety of emission wavelengths and emission hues and a good durability.

A further object of the present invention is to provide an organic luminescence device which can easily be prepared relatively inexpensively.

According to the present invention, there is provided an organic luminescence device, comprising: a pair of electrodes comprising an anode and a cathode, and an organic compound layer disposed between the pair of electrodes, wherein the organic compound layer comprises a compound represented by the following formula (I):

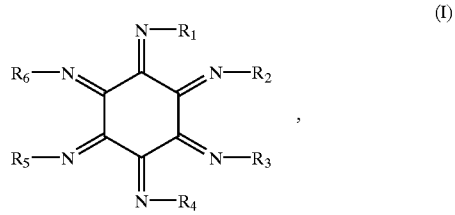

wherein $R_1$ to $R_6$ independently denote a substituted or unsubstituted alkyl group, a substituted or unsubstituted aryl group, a substituted or unsubstituted aralkyl group, or a substituted or unsubstituted heterocyclic group, with the proviso that each pair of $R_1$ and $R_2$, $R_3$ and $R_4$, an $R_5$ and $R_6$ or of $R_1$ and $R_6$, $R_2$ and $R_3$, and $R_4$ and $R_5$ may be connected to each other to form a fused ring structure.

By using the organic compound represented by the above-mentioned formula (1) in the organic luminescence device, it becomes possible to effect luminescence at a very high luminance under application of a lower voltage and provide an excellent durability.

Particularly, the organic compound layer comprising the compound of the formula (1) used in the present invention is useful as an electron injection layer.

Further, the resultant organic compound layer can be can be prepared through vacuum deposition, casting, wet-coating, etc., thus readily realizing a larger size thereof relatively inexpensively.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1:
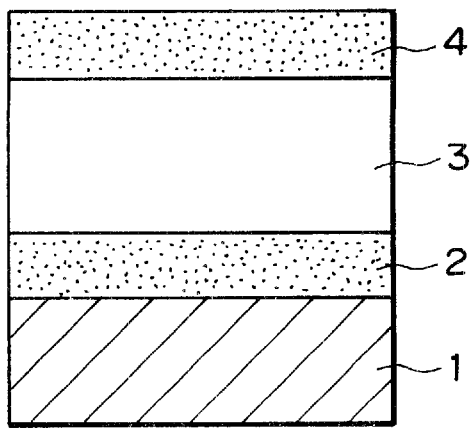
FIGS. 1 to 3 are schematic sectional views for illustrating a basic structure of an organic luminescence device according to an embodiment of the present invention, respectively.

The organic luminescence device according to the present invention is characterized in that the organic compound layer disposed between the pair of electrodes (anode and cathode) comprises a compound represented by the above-mentioned formula (I).

The organic compound layer may be formed in a single layer or a plurality of layers wherein at least one of the layers comprises the compound of the formula (I).

In the formula (I), the alkyl group may include a linear alkyl group selected from the group consisting of methyl group, ethyl group, propyl group, and hexyl group; and a branched alkyl group, such as isopropyl group or tert-butyl group. The aryl group for the formula (I) may include a monocyclic aromatic ring, such as is phenyl group; and the polycyclic aromatic ring, such as naphthyl group or anthryl group. The aralkyl group for the formula (I) may be selected from the group consisting of benzyl group, phenylpropyl group, and naphthylmethyl. The heterocyclic group for the formula (I) may include a monocyclic structure selected from the group consisting of pyrrolyl group, thienyl group, pyridyl group, and pyridazinyl group; and a condensed heterocyclic structure such as phenazinyl group or acrydinyl group.

For $R_1$ to $R_6$ in the formula (I), the substituted alkyl, aryl, aralkyl and heterocyclic groups may independently have a substituent selected from the group consisting of halogen atom, nitryl group, nitro group, formyl group, acetyl group, benzoyl group, amide group, styryl group, ethynyl group, phenyl group, naphthyl group, anthryl group, pyridyl group, pyridazinyl group, phenazinyl group, pytrolyl group, imidazolyl group, quinolyl group, and acridinyl group.

The fused ring structure for each pair of $R_1$ and $R_2$, $R_3$ and $R4$, and $R_5$ and $R_6$ (or $R_1$ and $R_6$, $R_2$ and $R_3$, and $R_4$ and $R_5$) may comprise benzene ring, naphthalene ring or pyridine ring.

The compound of the formula (I) used in the present invention may preferably have a tripyrazinocyclohexane skeleton and may more preferably be a tripyrazinocyclohexane derivative represented by the following formula (Ia):

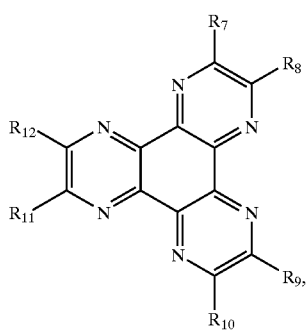

(Ia)

wherein $R_7$ to $R_{12}$ have the same definitions (meanings) as $R_1$ to $R_6$ in the above-mentioned formula (I).

Specific examples of the compound represented by the formula (I) (including the formula (Ia)) may include compounds (Example Compound Nos. (1) to (26)) shown below but are, however, not restricted to these compounds.

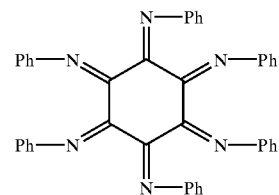

(1)

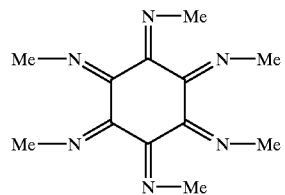

(2)

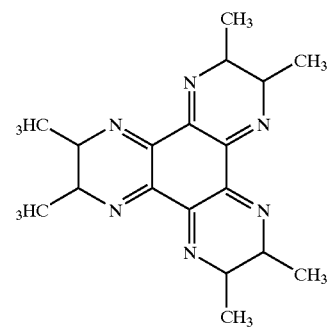

(3)

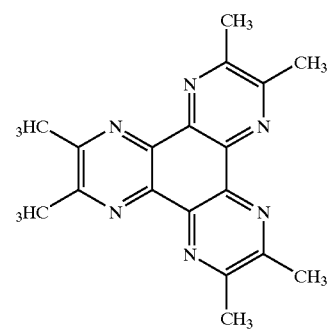

(4)

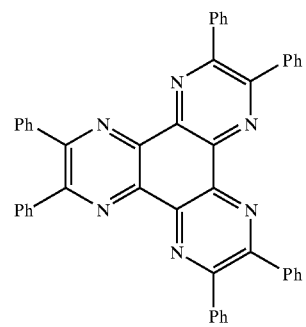

(5)

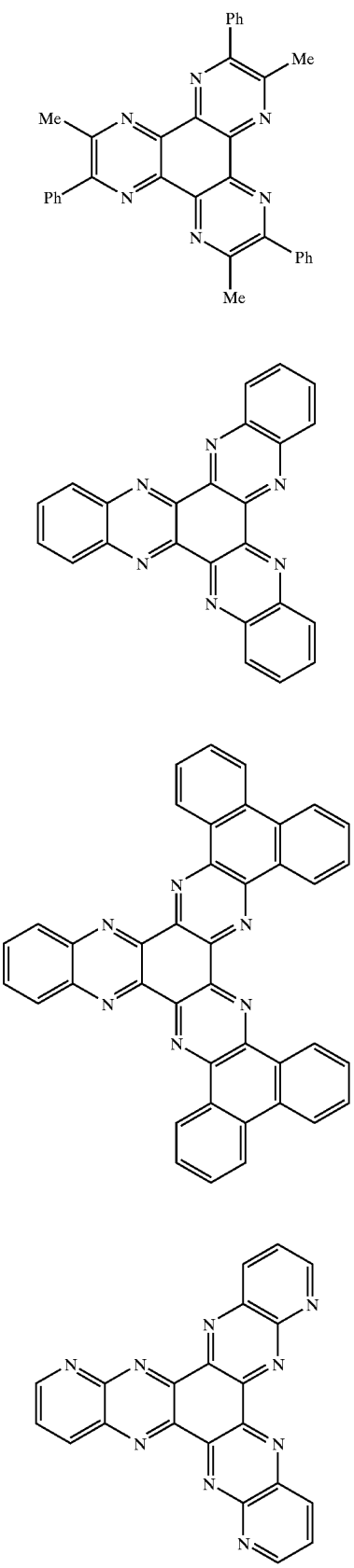

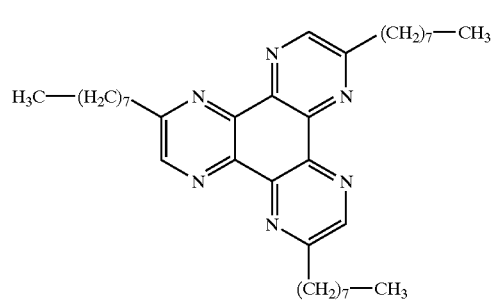
(15)
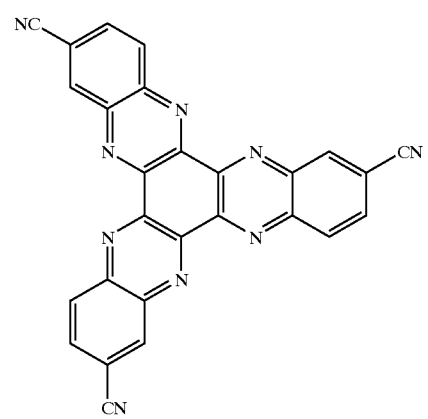
(18)
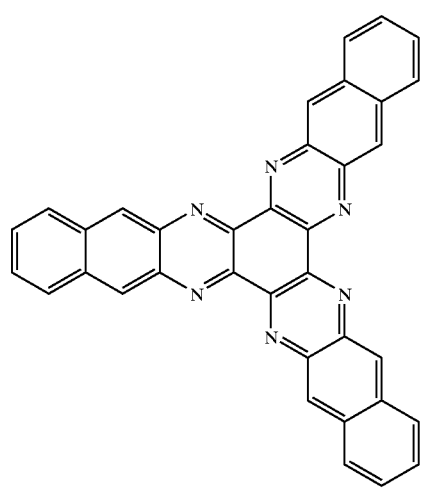
(16)
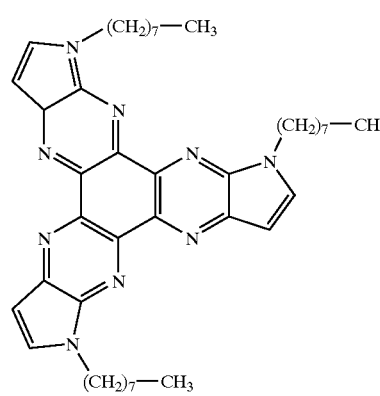
(19)
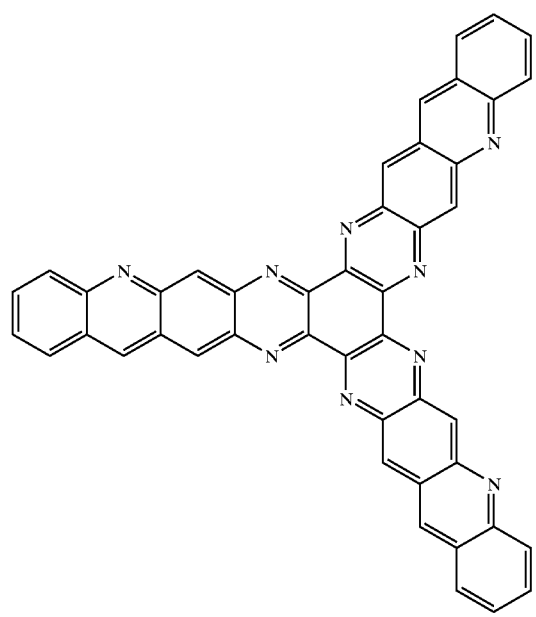
(17)
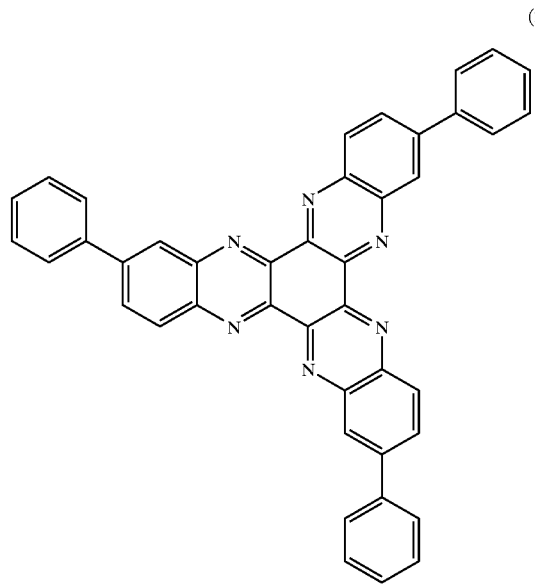
(20)

(21)
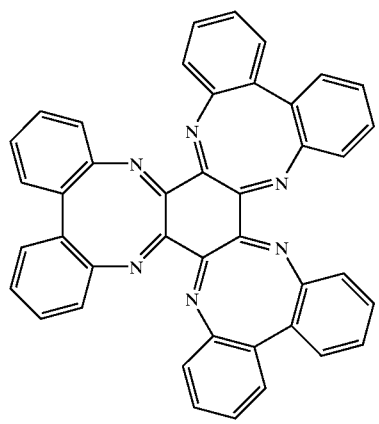
(22)
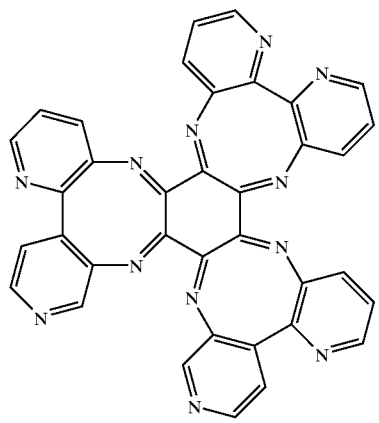
(23)
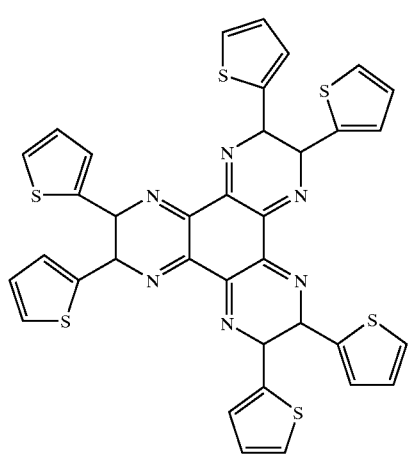
(24)
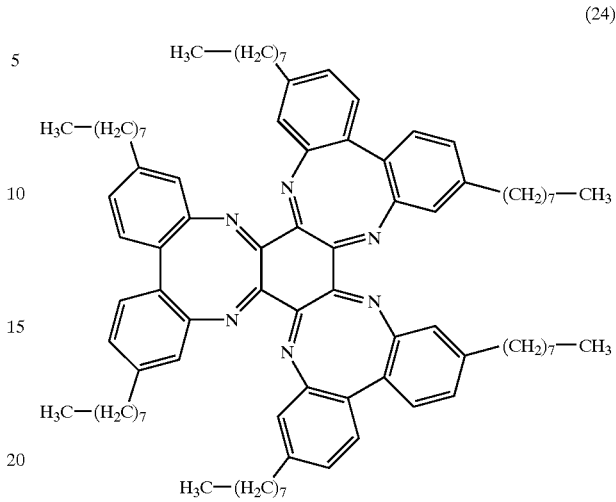
(25)
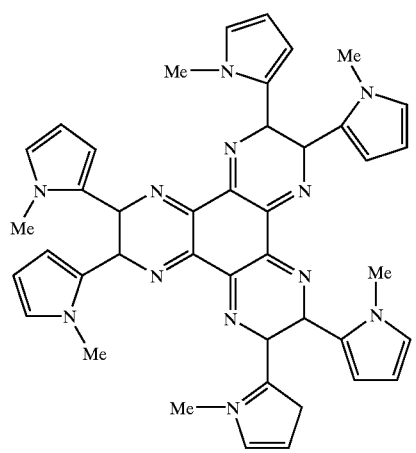
(26)
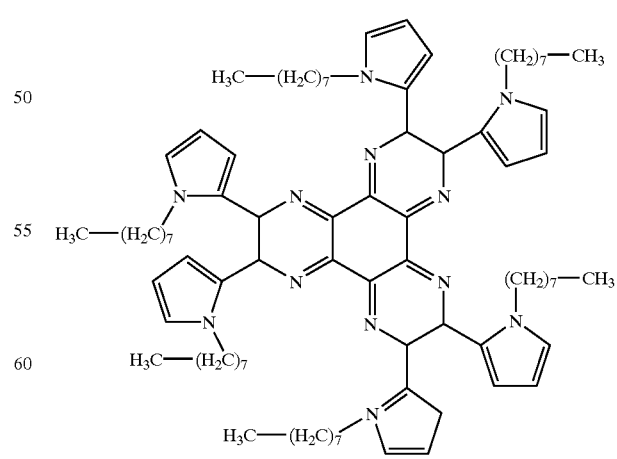

-continued

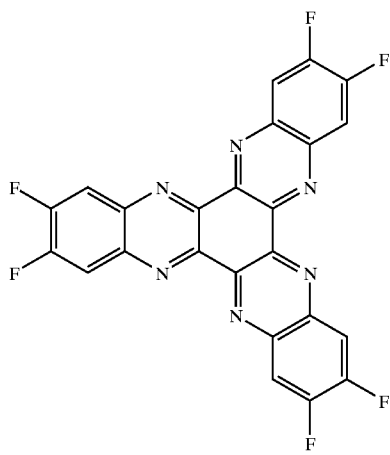

(27)

Among the above compounds (Ex. Comp. Nos. (1) to (27)), compounds of Ex. Comp. Nos. (5), (7), and (27) may preferably be used.

In the present invention, the above compounds of formula (I) (Ex. Comp. Nos. (1) to (27)) may generally be synthesized in the following manner.

Hexaminobenzene and a corresponding carbonyl compound were subjected to heat-refluxing with an appropriate solvent (e.g., toluene or xylene). After the heat-refluxing, the solvent was distilled off and the resultant residue was subjected to silica gel column chromatography (column: Wako-gel 300"; eluent: chloroform) to obtain an objective product.

More specifically, a compound of formula (I) (Ex. Comp. No. (5)) was prepared through the following reaction scheme:

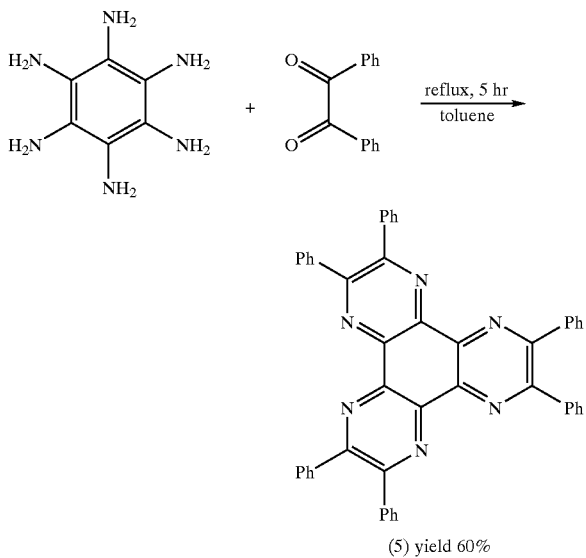

(5) yield 60%

In the organic luminescence device of the present invention, the organic compound layer comprising the above-mentioned compound of the formula (I) (preferably formula (Ia)) may be formed between the pair of anode and cathode (electrodes) through vacuum deposition or wet-coating process. The organic compound layer may preferably be formed in a thickness of at most 10 μm, more preferably at most 0.5 μm, further preferably 0.01–0.5 μm.

Figure 2:
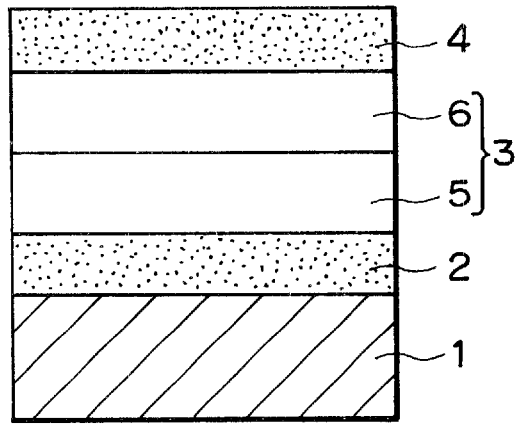
Figure 3:
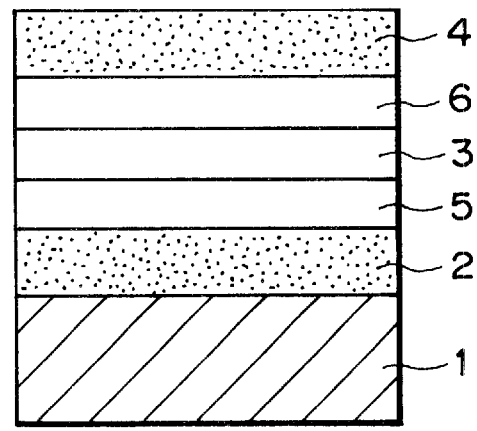

The organic compound layer constituting the organic luminescence device of the present invention may have a single-layer structure as shown in FIG. 1 and a lamination-layer structure of two or more layers as shown in FIGS. 2 and 3.

More specifically, FIG. 1 is a schematic sectional view illustrating an embodiment of the organic luminescence device of the present invention. Referring to FIG. 1, the organic luminescence device includes a substrate 1, an anode 2 disposed on the substrate 1, a luminescence layer 3 disposed on the anode 2, and a cathode 4 disposed on the luminescence layer 3. In this embodiment, the luminescence layer 3 constitutes a single layer-type organic compound layer and may exhibit hole transporting performance, electron transporting performance and luminescence performance in combination by itself or may contain a plural species of compounds exhibiting the performances, respectively, in mixture.

In this embodiment (FIG. 1), the luminescence layer 3 may preferably have a thickness of 5 nm to 1 μm, more preferably 10–50 nm.

FIG. 2 shows another embodiment of the organic luminescence device of the present invention including a lamination layer-type organic compound layer comprising a hole transporting layer 5 and an electron transporting layer 6. Referring to FIG. 2, the organic luminescence device includes a substrate 1, an anode 2 disposed on the substrate 1, the hole transporting layer 5 disposed on the anode 2, the electron transporting layer 6 disposed on the hole transporting layer 5, and a cathode 4 disposed on the electron transporting layer 6. In this embodiment, either one or both of the hole transporting layer 5 and the electron transporting layer 6 may contain a luminescent compound (material) for constituting a luminescence layer 3. In this case, the hole transporting layer and the electron transporting layer 6 may comprise a nonluminescent hole transporting compound and a nonluminescent electron transporting compound, respectively, or a nonluminescent compound having both a hole transporting function and an electron transporting function, respectively.

In this embodiment (FIG. 2), each of the hole transporting layer 5 and the electron transporting layer 6 may preferably have a thickness of 5 nm to 1 μm, more preferably 10–50 nm.

FIG. 3 shows another embodiment of the organic luminescence device of the present invention including a lamination layer-type organic compound layer comprising a hole transporting layer 5, a luminescence layer 3 and an electron transporting layer 6. Referring to FIG. 3, the organic luminescence device includes a substrate 1, an anode 2 disposed on the substrate 1, the hole transporting layer 5 disposed on the anode 2, the luminescence layer 3 disposed on the hole transporting layer 5, the electron transporting layer 6 disposed on the luminescence layer 3, and a cathode 4 disposed on the electron transporting layer 6. In this embodiment, a (charge) carrier transporting function and a luminescence function are separated into the hole transporting and electron transporting layers 5 and 6 and the luminescence layer 3. In each of the hole transporting layer 5, the electron transporting layer 6 and the luminescence layer 3, each of a hole transporting compound, an electron transporting compound and a luminescent compound may be used singly or in mixture of two or more species, respectively. In the case of using two or more species of each compound in combination, it becomes possible to allow a lot of latitude in selection of material used and the use of various compounds different in emission (luminescent) wavelength, thus providing a wide variety of emission hues. Further, it also becomes possible to effectively confine the respective carriers (hole and electron) or excitons in the luminescence layer 3 as a middle layer of the organic compound layer, thus improving emission (luminescence) efficiency. In this embodiment (FIG. 3), each of the hole transporting layer 5, the luminescence layer 3; and the electron transporting layer 6 may preferably have a thickness of 5 nm–1 μm, more preferably 10–50 nm.

In the above-mentioned embodiments (FIGS. 1–3), each of the anode 2, and the cathode 4 may generally have a thickness of 1000–2000 Å.

In the present invention, the layer structures of the organic compound layer shown in FIGS. 1–3 are merely a basic structure, respectively, and may be appropriately modified by forming at least one additional layer and/or by separating each layer into two or more layers.

Specifically, between the electrode (anode or cathode) and the organic compound layer, it is possible to dispose an electron injection layer (on the cathode side), a hole injection layer (on the anode side), an insulating layer, an adhesive layer or an interference layer. Further, the hole transporting layer 5 may be separated into two layers different in ionization potential.

In the present invention, a layer comprising the compound of the formula (I) may be formed as any of the hole transporting layer 5, the electron transporting layer 5 and the luminescence layer 3, and an additional layer since the compound of the formula (I) has not only an electron injection (and transport) function but also a hole blocking function.

In a preferred embodiment, the layer comprising the compound of the formula (I) may be formed as an (additional) electron injection layer disposed in the proximity of the cathode (e.g., between the cathode 4 and the electron transporting layer 6 shown in FIG. 2). In this case, the electron injection layer may preferably have a thickness of 1 nm to 1 μm, more preferably 1–50 nm. in the present invention, as described above, the compound of the formula (I) may be used in combination with the hole transporting compound, the electron transporting compound and/or the luminescent compound, as desired, examples of which may include those shown below.

Hole transporting compound

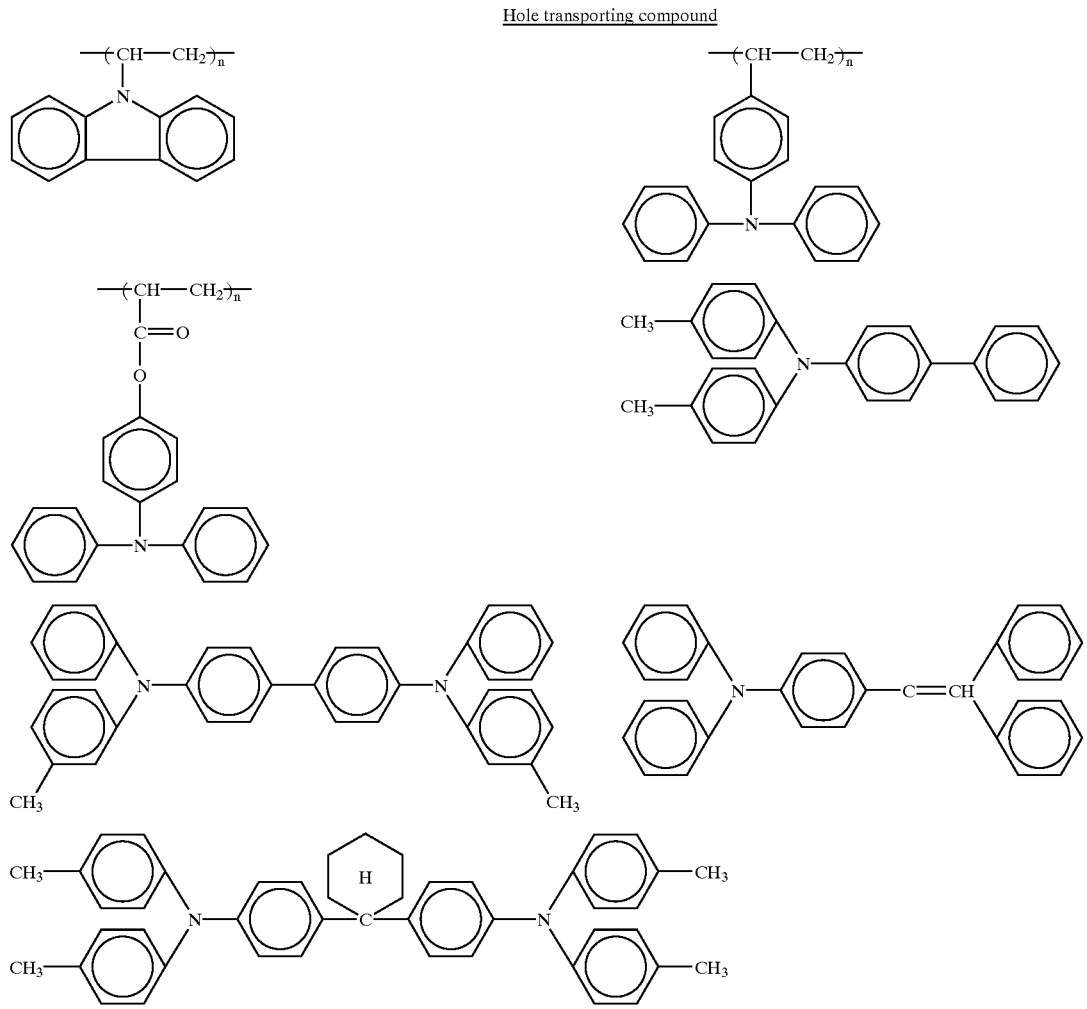

-continued
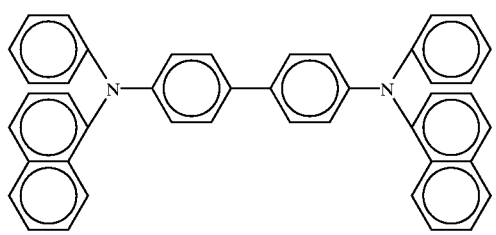
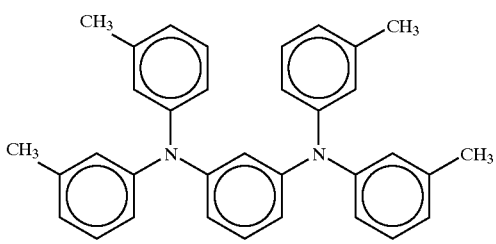
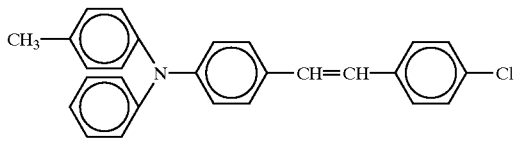
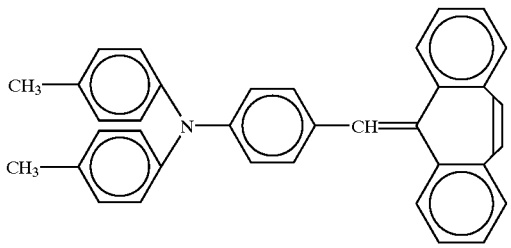
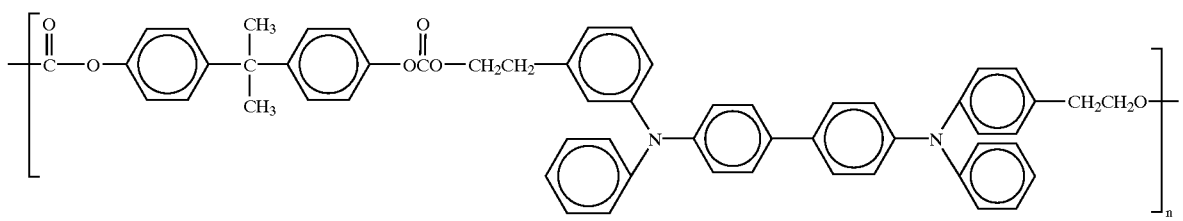
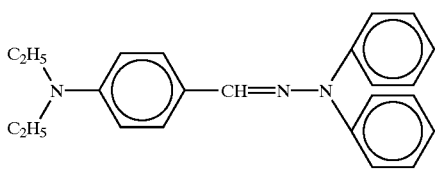
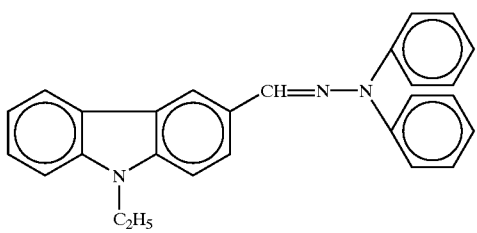
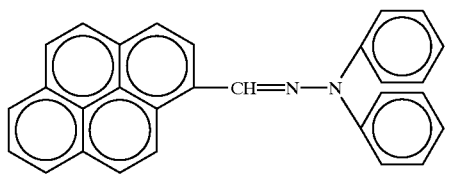
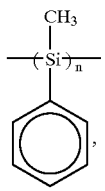
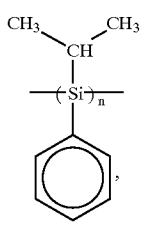
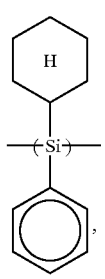
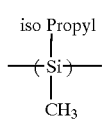
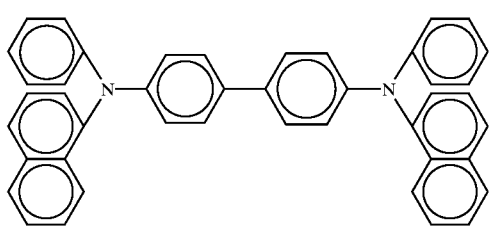

-continued
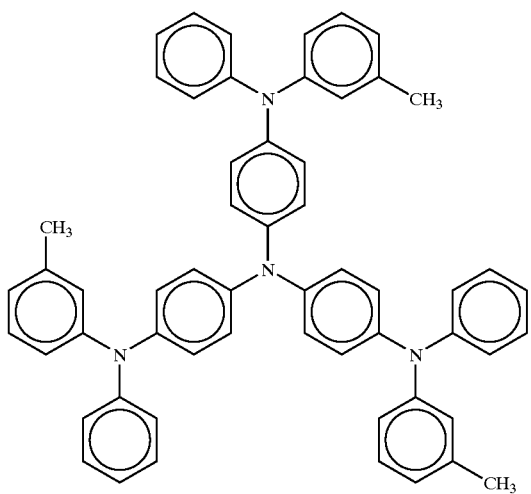
Electron transporting compound
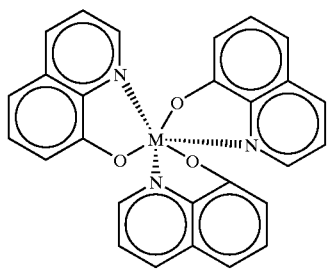
M: Al, Ga
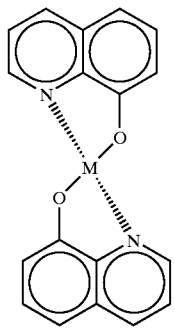
M: Zn, Mg, Be
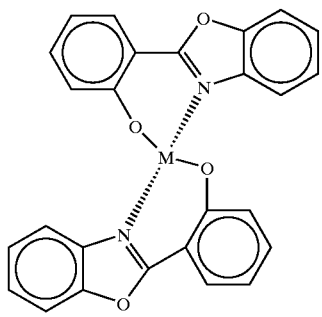
M: Zn, Mg, Be -continued
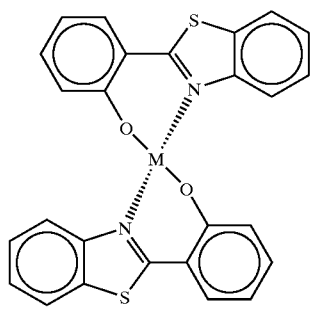
M: Zn, Mg, Be
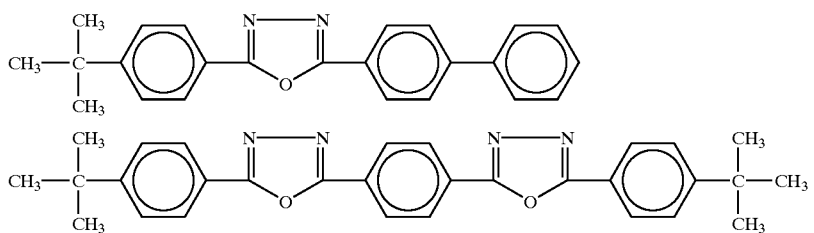
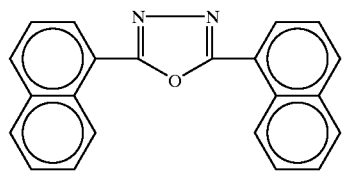
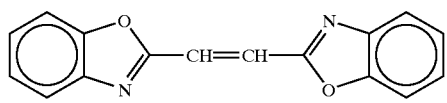
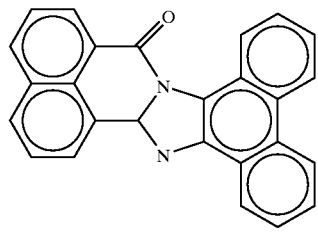
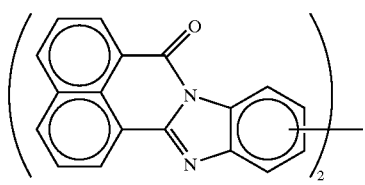
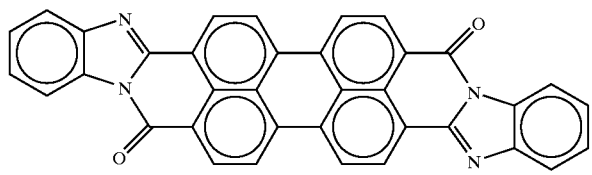
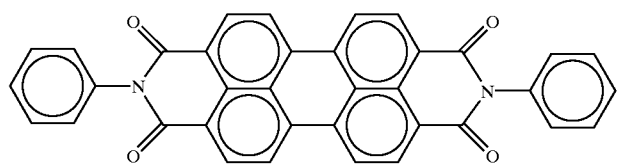
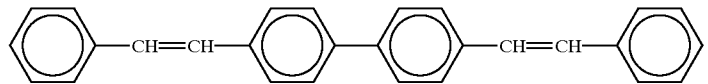

-continued
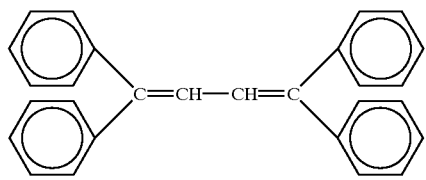
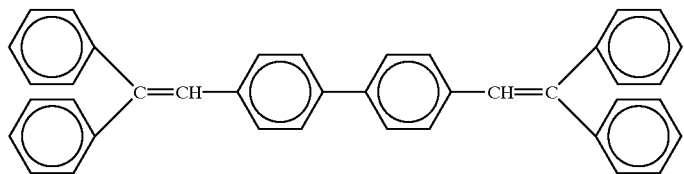
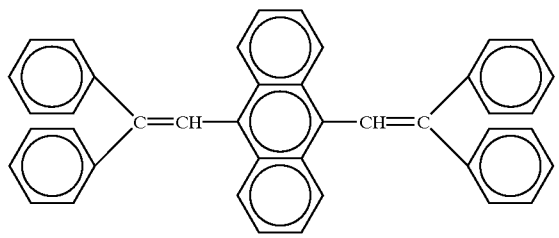
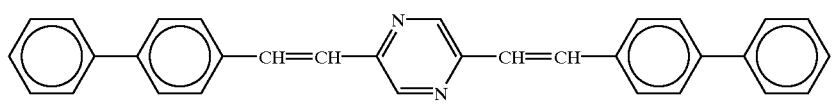
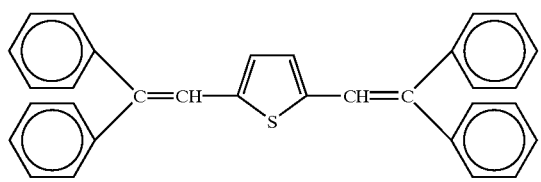
Luminescent compound (dopant colorant)
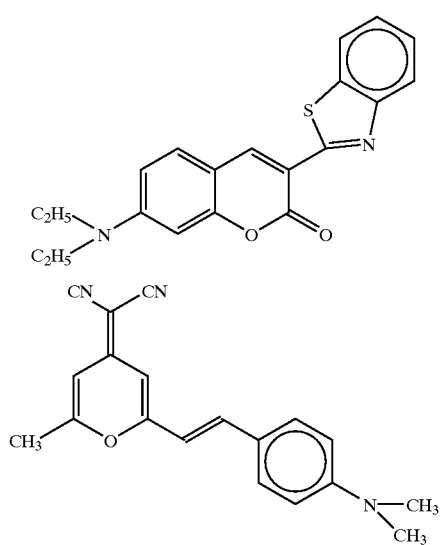
-continued
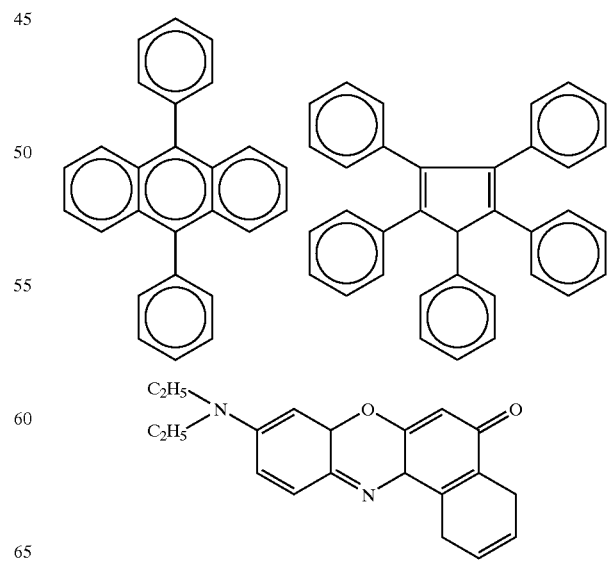

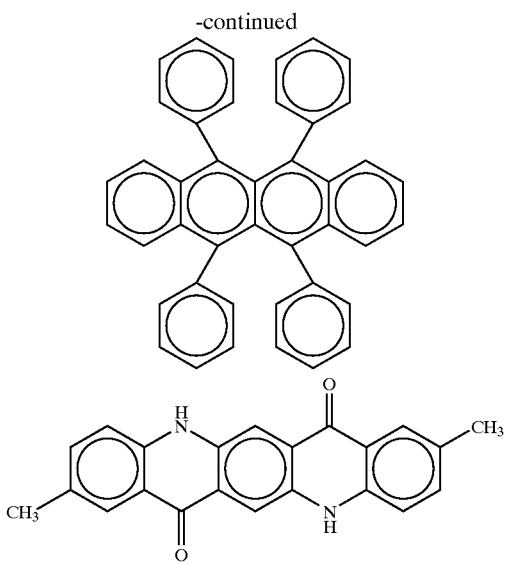

As mentioned above, the organic compound layer (comprising the compound of the formula (I)) used in the organic luminescence device of the present invention may be formed between the anode and the cathode through vacuum deposition or wet-coating process. The wet-coating process is one wherein the compound of the formula (I) is dissolved in an appropriate solvent optionally in combination with an appropriate binder resin. In this case, the compound of the formula (I) may preferably be added in an amount of 0.1–10 wt. parts per 100 wt. parts of the binder resin.

Examples of the binder resin may include various resins, such as polyvinyl carbazole resin, polycarbonate resin, polyester resin, polyarylate resin, polystyrene resin, acrylic resin, methacrylic resin, butyral resin, polyvinyl acetal resin, diallyl phthalate resin, phenolic resin, epoxy resin, silicone resin, polysulfone resin, and urea resin. These resins may be used singly or in combination of two or more species or in the form of copolymer.

As a material for the anode (e.g., 2 shown in FIGS. 1–3), it is preferred to use one having a work function a large as possible, examples of which may include: metals, such as gold, platinum, nickel, palladium, cobalt, selenium and vanadium, and their alloys; metal oxides, such as tin oxide, zinc oxide, indium tin oxide (ITO), and indium zinc oxide; and electroconductive polymers, such as polyaniline, polypyrrole, polythiophene, and polyphenylene sulfide. These compounds may be used singly or in combination of two or more species.

On the other hand, as a material for the cathode (e.g., 4 shown in FIGS. 1–3), it is preferred to use one having a work function as small as possible, examples of which may include: metals, such as lithium, sodium, potassium, calcium, magnesium, aluminum, indium, silver, lead, tin and chromium, and their alloys. It is also possible to use metal oxide, such as indium tin oxide (ITO). The cathode may be formed in a single layer or a lamination layer of plural layers.

The substrate (e.g., 1 shown in FIGS. 1–3) for the organic luminescence device of the present invention may include an opaque substrate of metal, ceramics, etc., and a transparent substrate of glass, quartz, plastics, etc. It is possible to form the substrate with a color filter film, a fluorescent color conversion film, a dielectric reflection film, etc., thus controlling emitted luminescent light.

In order to prevent contact with oxygen and/or moisture, the organic luminescence device of the present invention may further include a protective layer or a sealing layer. Examples of the protective layer may include: an inorganic film of diamond, metal oxide, metal nitride, etc.; a polymer film of fluorine-containing resin, polyparaxylene, polyethylene, silicone resin, polystyrene, etc., and a film of light-curable resin. It is also possible to effect packaging of the organic luminescence device per se with a sealing resin while covering the organic luminescence device with glass, gas-impermeable film, metal, etc.

Hereinbelow, the present invention will be described more specifically based on Examples.

EXAMPLE 1

An electroluminescence device was prepared in the following manner.

On a 1.1 mm-thick glass substrate, a 1200 Å-thick film of ITO (indium tin oxide) as an anode (transparent electrode), a 500 Å-thick film of TPD (N,N'-bis-(3-methylphenyl)-1,1'-biphenyl-4,4'-diamine) as a hole transporting layer, a 500 Å-thick film of tris(8-quinolinolato)aluminum complex as an electron transporting layer, a 20 Å-thick film of a compound of formula (I) (Ex. Comp. No. (5)) as an electron injection layer, and a 1500 Å-thick film of aluminum (Al) as a cathode were formed in succession through vacuum deposition.

When the thus-prepared organic luminescence device was driven, green electroluminescence was confirmed.

Figure 4:
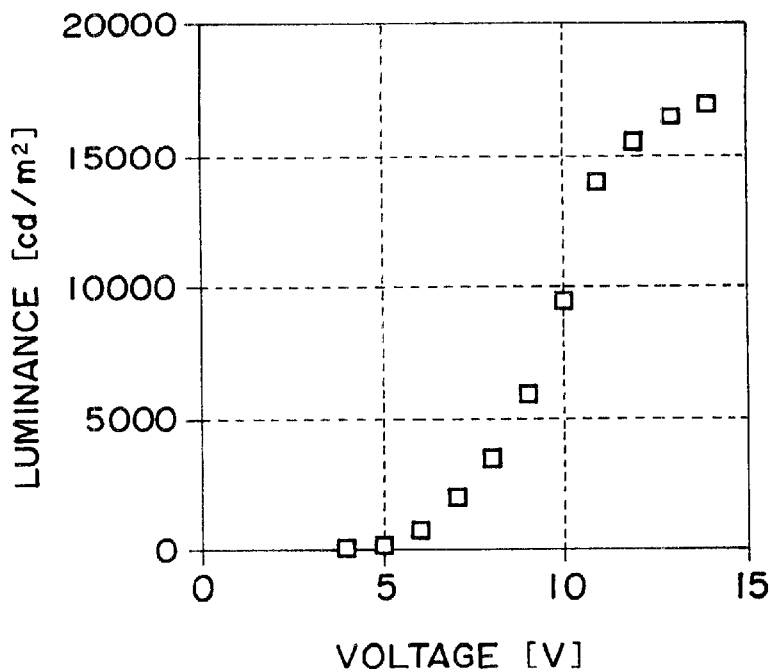
FIGS. 4 to 6 are graphs showing a voltage luminance (brightness) characteristic of the organic luminescence device of Example 1, the organic luminescence devices of Example 2 and Comparative Example 1 and the organic luminescence device of Example 3, respectively.

Further, the organic luminescence device showed a voltage-luminance characteristic as shown in FIG. 4.

Specifically, the voltage-luminance characteristic was measured in the following manner.

The above-prepared organic luminescence device was supplied with a prescribed voltage (from 0 volt at an increment of 1 volt) from a power supply ("R6161", mfd. by Adventest Co.). At each prescribed voltage, a luminance after 1 sec. of voltage application was measured by using a luminance meter ("BM-7FAST", mfd. by Topcon Co.).

EXAMPLE 2

An electroluminescence device was prepared and evaluated in the same manner as in Example 1 except that the compound of formula (I) (Ex. Comp. No. (5)) was changed to a compound of formula (I) (Ex. Comp. No. (7)).

Figure 5:
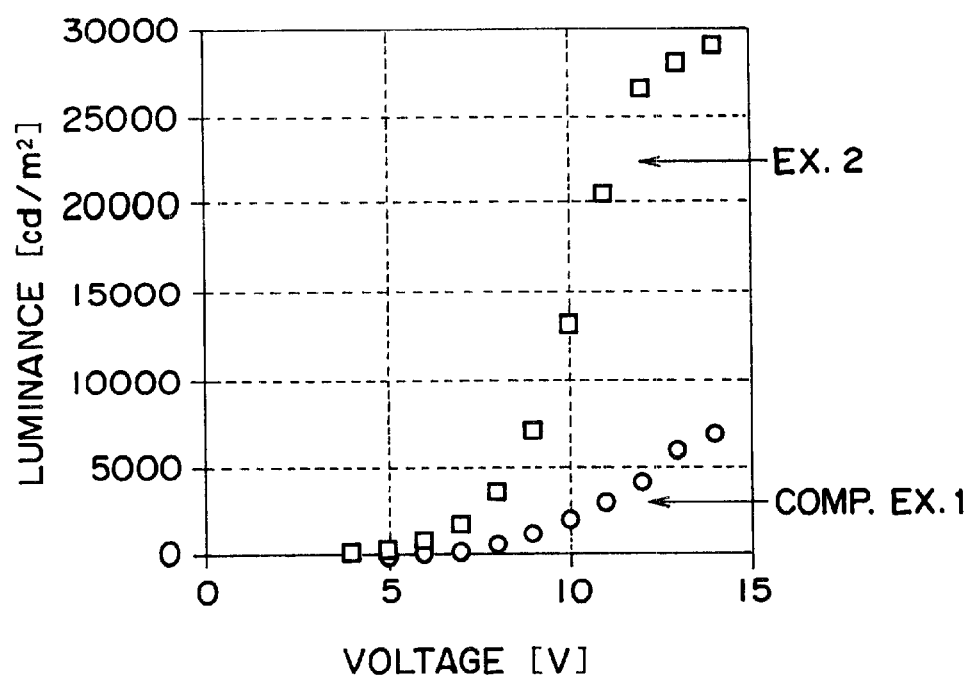

The thus-prepared organic luminescence device provided green electroluminescence and a voltage-luminance characteristic as shown in FIG. 5.

Comparative Example 1

An electroluminescence device was prepared and evaluated in the same manner as in Example 2 except that the film of compound of formula (I) (Ex. Comp. No. (7)) was not formed.

The thus-prepared organic luminescence device provided a voltage-luminance characteristic as shown in FIG. 5 together with that of the organic luminescence device prepared in Example 2.

As apparent from FIG. 2, the organic luminescence device using the compound of formula (I) (Example 2) showed a better voltage-luminance characteristic than the organic luminescence device lacking the compound of formula (I) (Comparative Example 1).

EXAMPLE 3

An electroluminescence device was prepared and evaluated in the same manner as in Example 1 except that the 500

Å-thick film of tris(8-quinolinolato)aluminum complex was changed to a 150 Å-thick film of tris(8-quinolinolato) aluminum complex doped with 5 wt. %-Nile Red (as a luminescence layer) and a 350 Å-thick film of tris(8-quinolinolato)aluminum complex (a an electron transporting layer) (formed in this order on the film of TPD).

Figure 6:
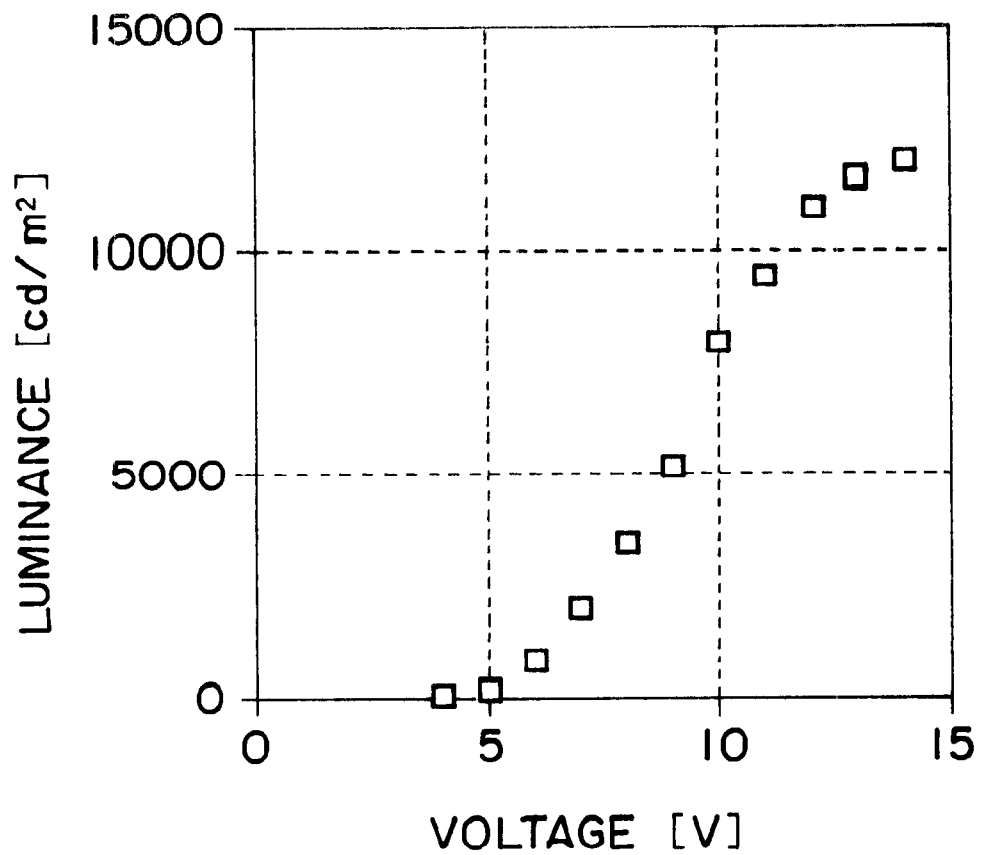

The thus-prepared organic luminescence device provided orange electroluminescence and a voltage-luminance characteristic as shown in FIG. 6.

What is claimed is:

1. An organic luminescence device, comprising: a pair of electrodes comprising an anode and a cathode, and an organic compound layer disposed between the pair of electrodes, wherein the organic compound layer comprises a compound represented by the following formula (I):

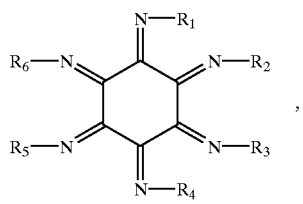

(I)

wherein $R_1$ to $R_6$ are each a substituted or unsubstituted alkyl group, a substituted or unsubstituted aryl group, a substituted or unsubstituted aralkyl group, or a substituted or unsubstituted heterocyclic group, wherein each pair of $R_1$ and $R_2$, $R_3$ and $R_4$, $R_5$ and $R_6$ or $R_1$ and $R_6$, $R_2$ and $R_3$, and $R_4$ and $R_5$ may be connected to each other to form a fused ring structure.

2. A device according to claim 1, wherein the alkyl group is a linear alkyl group.

3. A device according to claim 2, wherein the linear alkyl group is selected from the group consisting of methyl group, ethyl group, propyl group, and hexyl group.

4. A device according to claim 1, wherein the alkyl group is a branched alkyl group.

5. A device according to claim 4, wherein the branched alkyl group is isopropyl group or tert-butyl group.

6. A device according to claim 1, wherein the aryl group has a monocyclic aromatic ring.

7. A device according to claim 6, wherein the aryl group is phenyl group.

8. A device according to claim 1, wherein the aryl group has a polycyclic aromatic ring.

9. A device according to claim 8, wherein the aryl group is naphthyl group or anthryl group.

10. A device according to claim 1, wherein the aralkyl group is selected from the group consisting of benzyl group, phenylpropyl group, and naphthylmethyl.

11. A device according to claim 1, wherein the heterocyclic group has a monocyclic structure.

12. A device according to claim 11, wherein the heterocyclic group is selected from the group consisting of pyrrolyl group, thienyl group, pyridyl group, and pyridazinyl group.

13. A device according to claim 1, wherein the heterocyclic group has a fused ring structure.

14. A device according to claim 1, wherein the substituted alkyl, aryl, aralkyl and heterocyclic groups independently have a substituent selected from the group consisting of halogen atom, nitryl group, nitro group, formyl group, acetyl group, benzoyl group, amide group, styryl group, ethynyl group, phenyl group, naphthyl group, anthryl group, pyridyl group, pyridazinyl group, phenazinyl group, pyrrolyl group, imidazolyl group, quinolyl group, and acridinyl group.

15. A device according to claim 1, wherein the fused ring structure comprises benzene ring, naphthalene ring or pyridine ring.

16. A device according to claim 1, wherein the organic compound of the formula (I) has a tripyrazinocyclohexane skeleton.

17. A device according to claim 1, wherein the organic compound layer has a thickness of at most 10 μm.

18. A device according to claim 17, wherein the thickness is at most 5 μm.

19. A device according to claim 18, wherein the thickness is in the range of 0.01–0.5 μm.

* * * * *